US006127811A

United States Patent [19]
Shenoy et al.

[11] Patent Number: 6,127,811
[45] Date of Patent: Oct. 3, 2000

[54] MICRO-ELECTROMECHANICAL SYSTEM AND VOLTAGE SHIFTER, METHOD OF SYNCHRONIZING AN ELECTRONIC SYSTEM AND A MICROMECHANICAL SYSTEM OF A MICRO-ELECTROMECHANICAL SYSTEM

[75] Inventors: Jayarama N. Shenoy, Santa Clara; Subhas Bothra, San Jose, both of Calif.

[73] Assignee: VLSI Technology, Inc., Sunnyvale, Calif.

[21] Appl. No.: 09/228,707

[22] Filed: Jan. 12, 1999

[51] Int. Cl.[7] .................................................. H01M 10/46
[52] U.S. Cl. ............................................................. 320/166
[58] Field of Search ............................ 320/166; 333/202, 333/205; 73/514.01, 514.35, 514.36

[56] References Cited

U.S. PATENT DOCUMENTS

| | | |
|---|---|---|
| 5,610,335 | 3/1997 | Shaw et al. . |
| 5,808,527 | 9/1998 | De Los Santos . |
| 5,889,389 | 3/1999 | Bothra et al. ............................ 320/166 |

OTHER PUBLICATIONS

S. T. Cho, et al., *An Ultrasensitive Silicon Pressure–Based Flowmeter*, (1989). no month.

Michael J. Daneman, et al., Journal of Microelectromechanical Systems, vol. 5, No. 3, *Linear Microvibromotor of Positioning Optical Components*, Sep. 1996, pp. 159–165.

Gary K. Fedder, et al., Journal of Microelectromechanical Systems, vol. 5, No. 4, *Multimode Digital Control of a Suspended Polysisicon Microstructure*, Dec. 1996, pp. 283–286.

Electromagnetics, Chapter 2, *The Static Electric Field, Part 2*, pp. 62–65. no date.

*Primary Examiner*—Edward H. Tso
*Attorney, Agent, or Firm*—Wells, St. John, Roberts, Gregory & matkin, P.S.

[57] ABSTRACT

The present invention includes a micro-electromechanical system and voltage shifter, method of synchronizing an electronic system and a micromechanical system of a micro-electromechanical system. According to one aspect, the present invention provides a micro-electromechanical system voltage shifter including at least one node; a capacitor including plural opposing conductive plates; a micromechanical system configured to vary the capacitance of the capacitor; an electrical system configured to selectively couple the capacitor and the at least one node; and a mixer configured to output a product signal to synchronize the micromechanical system and the electrical system. Another aspect provides a method of synchronizing an electronic system and a micromechanical system of a micro-electromechanical system voltage shifter, the method including providing a capacitor and at least one node; varying the capacitance of the capacitor using a micromechanical system; selectively coupling the capacitor with the at least one node using an electrical system to one of charge the capacitor and provide sampling of the voltage of the capacitor; and synchronizing the electrical system and the micromechanical system.

32 Claims, 4 Drawing Sheets

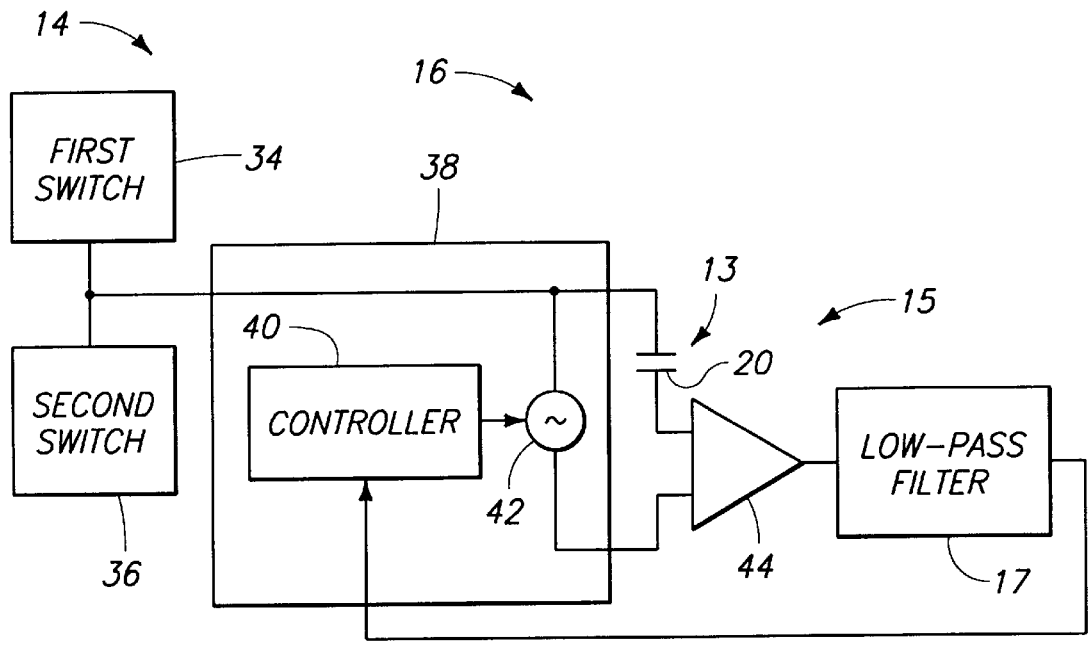
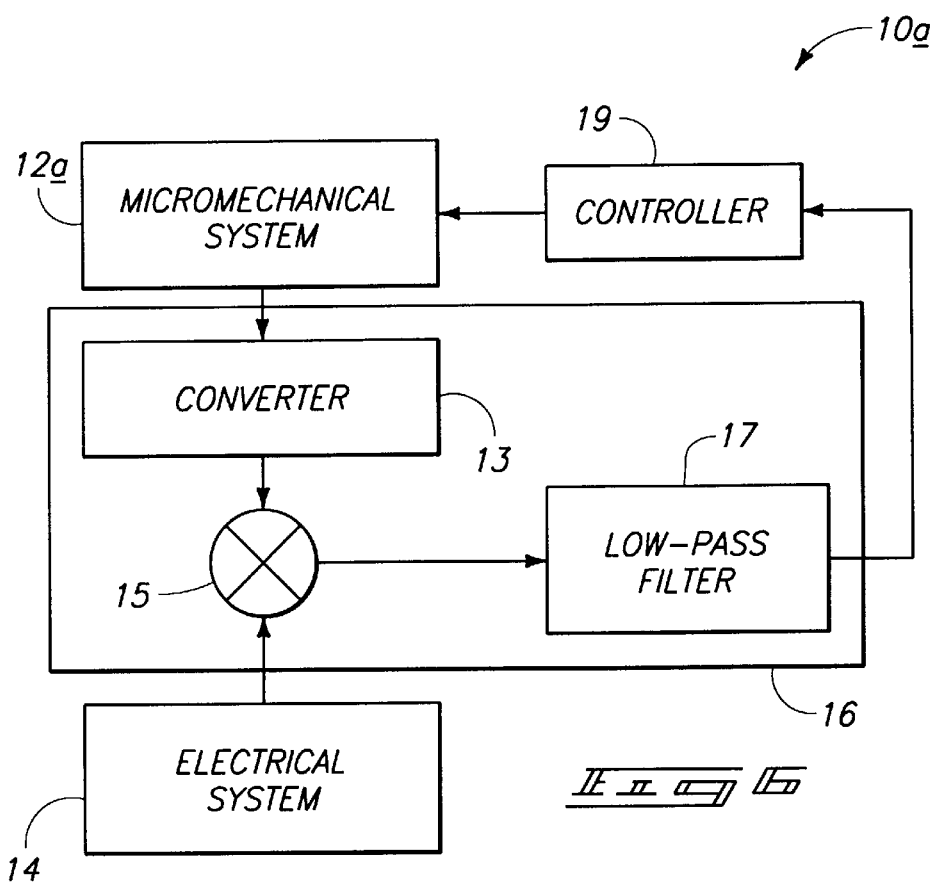

MICRO-ELECTROMECHANICAL SYSTEM AND VOLTAGE SHIFTER, METHOD OF SYNCHRONIZING AN ELECTRONIC SYSTEM AND A MICROMECHANICAL SYSTEM OF A MICRO-ELECTROMECHANICAL SYSTEM

TECHNICAL FIELD

The present invention relates to a micro-electromechanical system and voltage shifter, method of synchronizing an electronic system and a micromechanical system of a micro-electromechanical system.

BACKGROUND OF THE INVENTION

A technology referred to as micro-machining and micro-electromechanics has emerged relatively recently as a result of advances in semiconductor technology, especially in the field of semiconductor processing. Micro-electromechanical systems (MEMS) are complex systems which individually include one or more electrical systems and one or more micromechanical systems. The micro-electromechanical systems are fabricated using many of the same fabrication techniques that have miniaturized electronic circuits and made mass production of silicon integrated circuit chips possible. Micro-electromechanical systems are typically made of silicon, polysilicon, silicon nitride and silicon dioxide on silicon wafers.

More specifically, utilizing fabrication techniques such as wet etching and photolithography, basic structures like grooves, holes, trenches, hemispheres, cantilevers, gears, and shafts, etc., can be built upon or within a silicon wafer. From these basic structures, a wide variety of micro-mechanical devices can be constructed. For example, among the numerous micro-electromechanical systems that have been successfully implemented are valves, springs, nozzles, printer heads, accelerometers, and chemical sensors. More complex devices, such as gas chromatographs, can be fabricated upon a silicon wafer a few centimeters in diameter.

In micro-electromechanical systems, a plurality of such electrical and micro-mechanical devices are integrated. For instance, a power supply, a micro-motor and a chemical sensor may be constructed on a single chip. These various different electrical and micro-mechanical devices may require different voltage levels to operate. Conventionally, these different voltage levels are provided by potential dividers or transformers. However, conventional voltage converters may not be fast enough for certain micro-electromechanical applications which require a relatively fast response time. Accordingly, a voltage shifter that is compatible with micro-electromechanical systems has been developed and is described in a U.S. patent application entitled Micro-Electromechanical Voltage Shifter, having Ser. No. 09/014,832, filed Jan. 28, 1998, now U.S. Pat. No. 5,889,389, issued Mar. 3, 1999, naming Jayarama N. Shenoy and Subhas Bothra as inventors, and incorporated herein by reference.

Some form of synchronization between plural systems may be desired inasmuch as mechanical and electrical systems are typically simultaneously operating within a micro-electromechanical system. Synchronization may be necessary for basic operation and/or for enhanced efficiency in operation of the micro-electromechanical system.

Therefore, the present invention provides devices and methodologies for providing synchronization in micro-electromechanical systems.

BRIEF DESCRIPTION OF THE DRAWINGS

Preferred embodiments of the invention are described below with reference to the following accompanying drawings.

FIG. 5 is a schematic diagram of one configuration of a synchronizer of the micro-electromechanical system of FIG. 2.

FIG. 6 is a functional block diagram of a micro-electromechanical system according to another embodiment.

DETAILED DESCRIPTION OF THE PREFERRED EMBODIMENTS

Figure 1:
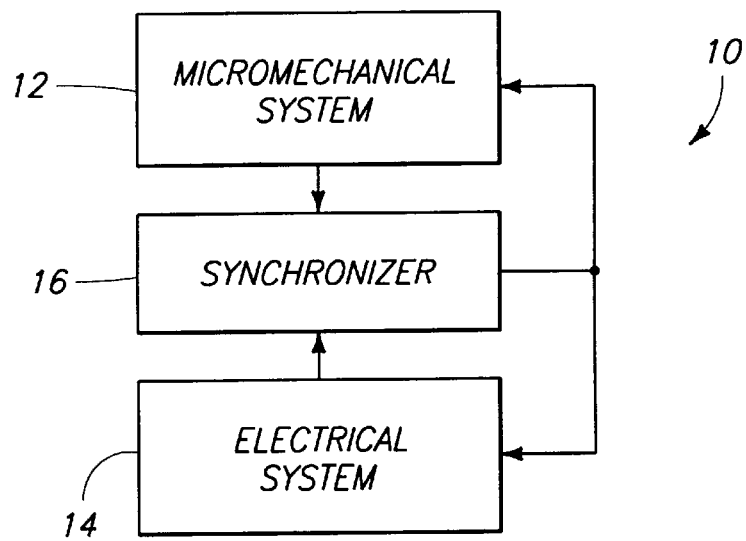
FIG. 1 is a functional block diagram of a micro-electromechanical system having a synchronizer according to the present invention.

This disclosure of the invention is submitted in furtherance of the constitutional purposes of the U.S. Patent Laws "to promote the progress of science and useful arts" (Article 1, Section 8).

According to one aspect, the present invention provides a micro-electromechanical system voltage shifter including at least one node; a capacitor including plural opposing conductive plates; a micromechanical system configured to vary the capacitance of the capacitor; an electrical system configured to selectively couple the capacitor and the at least one node; and a mixer configured to output a product signal to synchronize the micromechanical system and the electrical system.

A second aspect of the present invention provides a micro-electromechanical system comprising: an electrical system operating according to a first electrical quantity; a micromechanical system operating according to a mechanical quantity; and a synchronizer configured to convert the mechanical quantity to a second electrical quantity, and to mix the first electrical quantity and the second electrical quantity to generate a product signal to synchronize the electrical system and the micromechanical system.

Another aspect of the invention provides a micro-electromechanical system voltage shifter comprising: a voltage source; an output node; a capacitor including plural opposing conductive plates; a first switch operable to selectively couple the voltage source with the capacitor to charge the capacitor to a first voltage; a micromechanical system configured to vary the capacitance of the capacitor to provide a second voltage across the capacitor, the micromechanical system being configured to operate according to a mechanical quantity; a second switch operable to selectively couple the capacitor with the output node to provide sampling of the second voltage of the capacitor; an electrical system configured to control the operation of at least one of the first switch and the second switch according to a first electrical quantity; wherein the capacitor is configured to convert the mechanical quantity to a second electrical quantity; a mixer configured to mix the first electrical quantity and the second electrical quantity to generate a product signal; and a low-pass filter configured to filter the product signal and apply the product signal to one of the micromechanical system and the electrical system to synchronize the electrical system and the micromechanical system. The low-pass filter preferably integrates over time the product signal prior to application thereof to the micromechanical system and the electrical system.

Another aspect provides a method of synchronizing an electronic system and a micromechanical system of a micro-electromechanical system voltage shifter, the method comprising: providing a capacitor and at least one node; varying the capacitance of the capacitor using a micromechanical system; selectively coupling the capacitor with the at least one node using an electrical system to one of charge the capacitor and provide sampling of the voltage of the capacitor; and synchronizing the electrical system and the micromechanical system.

According to another aspect, the present invention provides a method of synchronizing an electronic system and a micromechanical system of a micro-electromechanical system, the method comprising: providing a micro-electromechanical system including an electrical system and a micromechanical system; operating the electrical system according to a first electrical quantity; operating the micromechanical system according to a mechanical quantity; converting the mechanical quantity to a second electrical quantity; generating a product signal from the first electrical quantity and the second electrical quantity; and synchronizing the electronic system and the micromechanical system using the product signal.

Referring to FIG. 1, a micro-electromechanical system (MEMS) is generally depicted as reference number 10. The depicted micro-electromechanical system 10 includes a micromechanical system 12, an electrical system 14 and a synchronizer 16. As illustrated further below, micromechanical system 12 is configured to operate according to a mechanical quantity (e.g., a position of a wheel). Electrical system 14 is configured to operate according to an electrical quantity (e.g., a time-dependent voltage or current). Synchronizer 16 is coupled with micromechanical system 12 and electrical system 14 and is configured to synchronize the operation of micromechanical system 12 and electrical system 14.

In an exemplary embodiment described in detail below, synchronizer 16 is configured to convert the mechanical quantity of micromechanical system 12 to an electrical quantity. Synchronizer 16 further mixes the electrical quantity of electrical system 14 with the electrical quantity of micromechanical system 12 to provide a product signal. The product signal may be integrated over time to provide a stable product signal. The generated product signal can be utilized to synchronize electrical system 14 and micromechanical system 12. In one embodiment, synchronizer 16 is configured to apply the product signal to electrical system 14 to provide synchronization. Alternatively, synchronizer 16 provides the product signal to micromechanical system 12 in another configuration to provide the synchronization.

Referring to FIG. 2–FIG. 5, an exemplary configuration of micro-electromechanical system 10 is described. The depicted configuration of micro-electromechanical system 10 is operable to adjust electrical system 14 responsive to a mechanical quantity of micromechanical system 12 to provide synchronization of micromechanical system 12 and electrical system 14.

Figure 7:
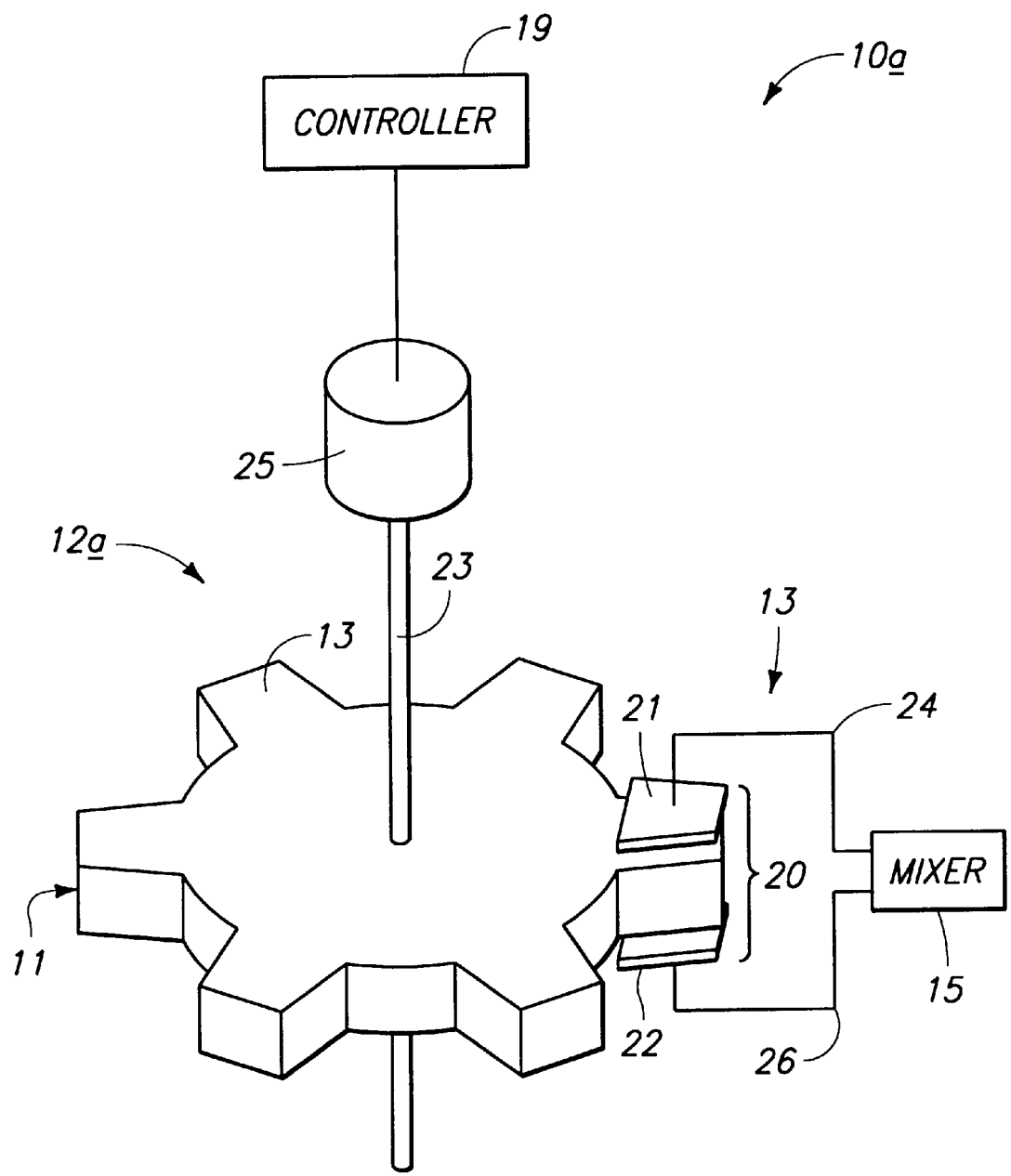
FIG. 7 is an illustrative representation of some of the components of the micro-electromechanical system of FIG. 6.

Referring to FIG. 6–FIG. 7, another configuration of micro-electromechanical system 10a is described. The configuration of micro-electromechanical system 10a depicted in FIG. 6–FIG. 7 is operable to adjust micromechanical system 12 responsive to an electrical quantity of electrical system 14 to provide synchronization of micromechanical system 12 and electrical system 14.

Figure 2:
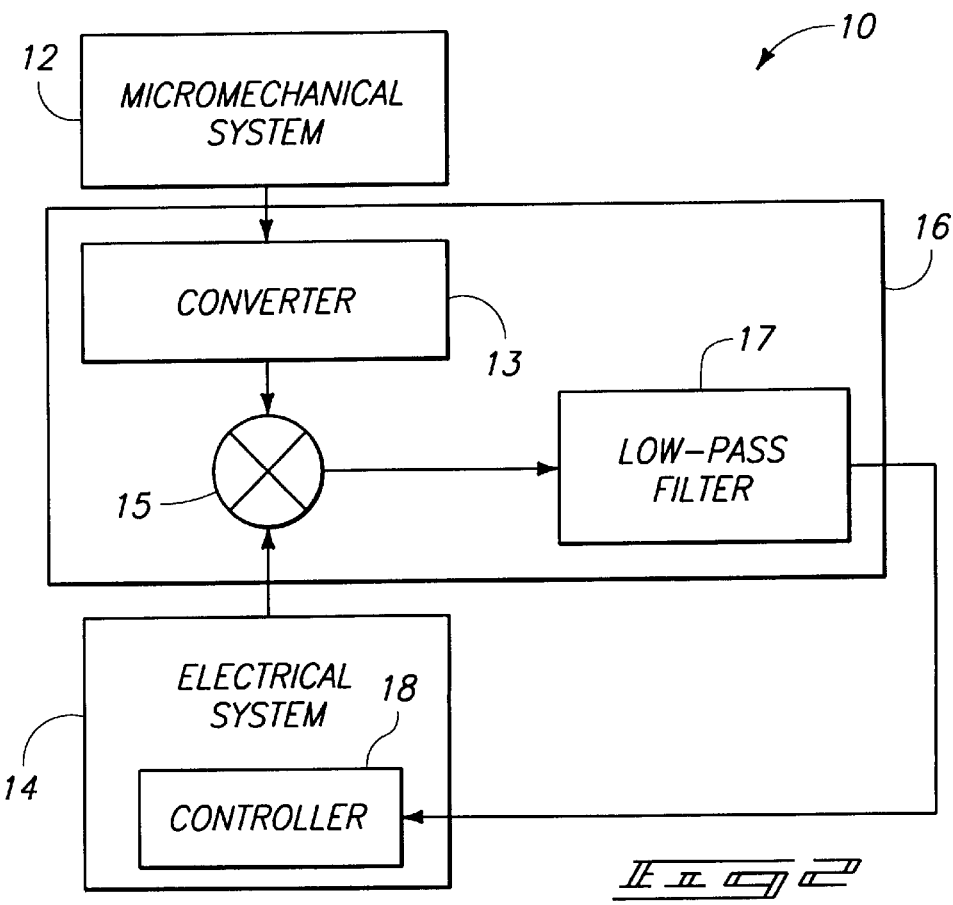
FIG. 2 is a functional block diagram of a micro-electromechanical system according to one embodiment.

Referring specifically to FIG. 2, a block diagram of an exemplary micro-electromechanical system 10 is depicted. Micromechanical system 12 is configured to operate at a mechanical quantity, such as rotational velocity, acceleration, etc. Micromechanical system 12 is coupled with synchronizer 16. The illustrated synchronizer 16 includes a converter 13, a mixer 15 and a low-pass filter 17.

Converter 13 is coupled with micromechanical system 12. Converter 13 is configured to convert the mechanical quantity of micromechanical system 12 into an electrical quantity. Mixer 15 is coupled with converter 13 and electrical system 14. Electrical system 14 is configured to operate according to an electrical quantity, such as a time-dependent voltage or current. Mixer 15 is configured to mix the electrical quantity outputted from converter 13 and the electrical quantity outputted from electrical system 14. Mixer 15 generates a product signal responsive to the mixing of the electrical quantities. The product signal is a resulting quantity (e.g., current) which is indicative of the difference in frequency and/or phase between the two input quantities.

Mixer 15 is coupled with low-pass filter 17. Mixer 15 applies the product signal to low-pass filter 17 which provides signal processing to remove higher order (e.g., second order and higher) components from the product signal, and thus integrates the product signal into a stable product signal. Low-pass filter 17 outputs the product signal, also referred to as a control signal, which can be used as feedback to suitably alter either the micromechanical system or electrical system to provide synchronous operation. In the depicted micro-electromechanical system 10, the product signal is outputted from low-pass filter 17 and applied to electrical system 14. For example, electrical system 14 includes a controller 18 which adjusts the operation of electrical system 14 to provide synchronization of electrical system 14 with micromechanical system 12 responsive to the product signal. Synchronous operation is substantially achieved when there is no frequency difference between the micromechanical and electrical systems. The control signal tends to drift to a zero value when synchronization is achieved.

Figure 3:
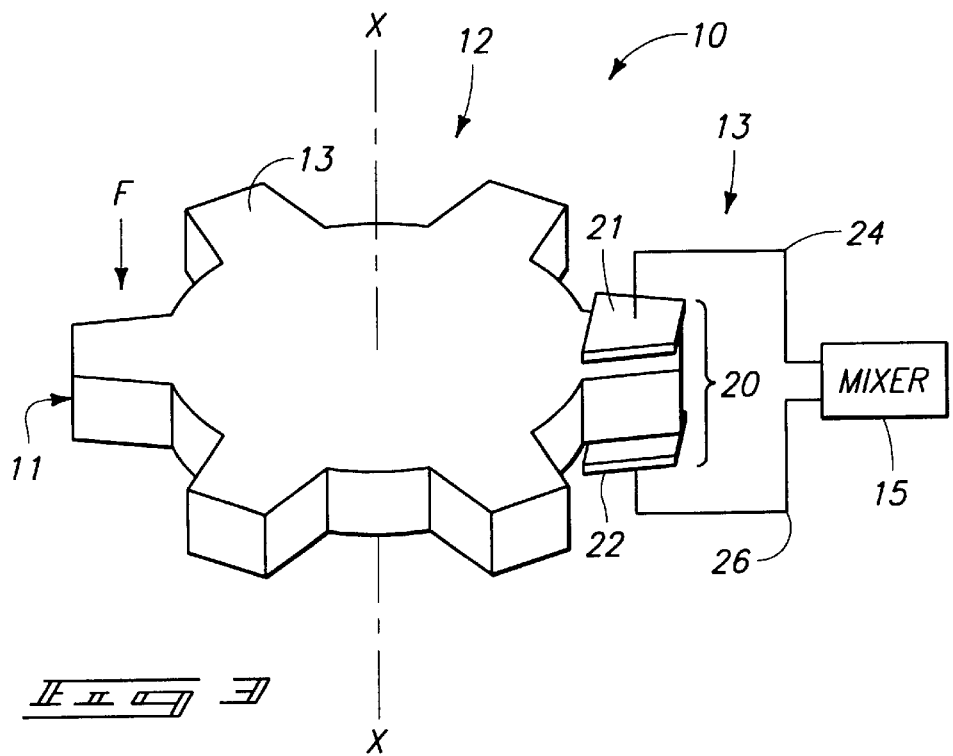
FIG. 3 is an illustrative representation of some of the components of the micro-electromechanical system of FIG. 2.

Referring to FIG. 3, micro-electromechanical system 10 is implemented as a micro-electromechanical system voltage shifter. The operation of an exemplary voltage shifter is described in U.S. patent application entitled Micro-Electromechanical Voltage Shifter and incorporated herein by reference above.

In general, the depicted voltage shifter includes a micro-electromechanical gear wheel 11 and a parallel-plate capacitor 20 having a pair of capacitor plates 21, 22. Gear wheel 11 comprises a micromechanical wheel formed using semiconductor processing techniques in the described embodiment. Gear wheel 11 is circular in shape and comprises a plurality of teeth 13 which protrude radially from the center of gear wheel 11. Further, gear wheel 11 is positioned to a side of capacitor 20 and is configured to rotate about an axis X—X generally perpendicular to capacitor plates 21, 22 such that teeth 13 individually pass between capacitor plates 21, 22.

During operation, gear wheel 11 may be rotated to an "initial" position wherein a single tooth 13 is interposed between capacitor plates 21, 22. According to one embodiment, individual teeth 13 are made of a dielectric material having a high dielectric constant such as polysilicon. Thus, in the "initial" position, capacitor 20 has an initial capacitance of $C_1$.

Individual plates 21, 22 of capacitor 20 are coupled with nodes 24, 26. An external voltage supply (shown in FIG. 4) can be selectively coupled with nodes 24, 26 and operable to charge capacitor 20 to an initial voltage when a tooth 13 is interposed between plates 20, 21. After capacitor 20 is charged to the initial voltage, capacitor 20 is electrically isolated such that charges are conserved. In one embodiment, capacitor 20 is selectively disconnected from the voltage supply using one or more switches (also shown in FIG. 4).

Further rotation of gear wheel 11 rotates the individual tooth 13 previously interposed between capacitor plates 21, 22 outward providing a dielectric medium comprising air intermediate plates 21, 22. The capacitance of capacitor 20 is changed from the initial value $C_1$ to another value $C_2$ along with a corresponding shift in voltage across capacitor 20. Thus, the initial voltage across capacitor 20 is shifted to another voltage implementing voltage shifting operations. The voltage V across capacitor 20 shifts according to a ratio of dielectric constants of the dielectric media initially and subsequently interposed between capacitor plates 21, 22. The final voltage may be sampled or utilized to drive other electromechanical parts of the micro-electromechanical system 10. Accordingly, capacitor 20 may be discharged or recharged numerous times during use.

The depicted voltage shifter can be configured to operate as a sensing device to monitor a mechanical condition, such as the flow of a fluid as represented by F. The flow F of fluid causes rotation of wheel 11 in a counterclockwise direction about axis X—X. Rotational velocity of wheel 11 may be referred to as the mechanical quantity as previously indicated.

Capacitor 20 operates to convert the mechanical quantity into an electrical quantity. As such, capacitor 20 comprises converter 13 in the presently described embodiment. Rotation of wheel 11 creates a time-dependent capacitance within capacitor 20 intermediate nodes 24, 26 having a fundamental component of $$C = C_0 * \sin(\omega_{mech} t)$$

The output from capacitor 20 is applied to mixer 15. The time-dependent capacitance is utilized in the described embodiment to provide synchronization of micromechanical system 12 and electrical system 14.

Figure 4:
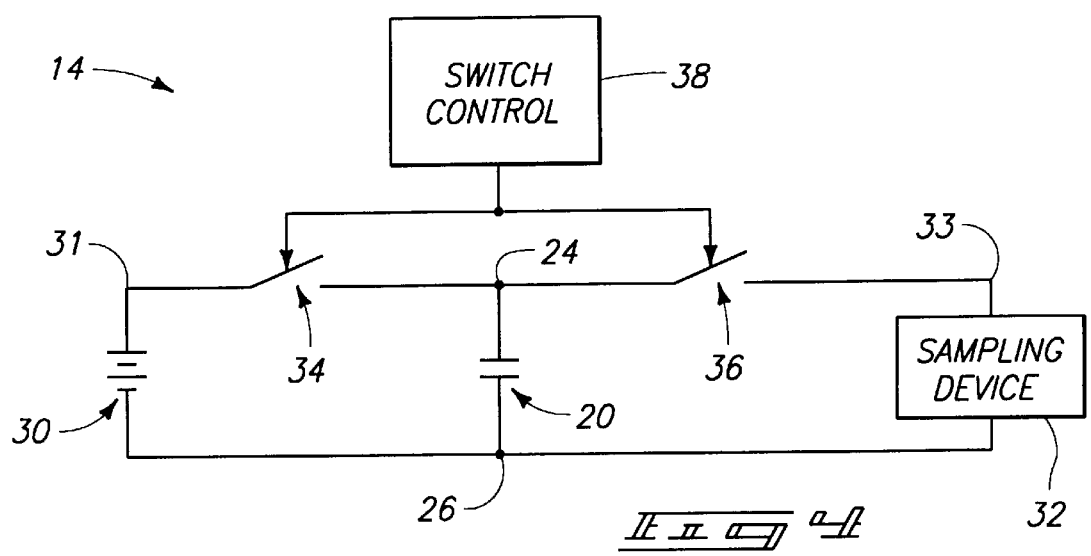
FIG. 4 is a schematic diagram of one configuration of an electrical system of the micro-electromechanical system of FIG. 2.

Referring to FIG. 4, an exemplary electrical system 14 is depicted. The illustrated electrical system 14 is configured to provide selective charging of capacitor 20, as well as selective sampling or discharging of capacitor 20. Electrical system 14 includes a charging device 30, such as a direct current (DC) battery, and a sampling device 32. Charging device 30 is coupled with a node 31 and sampling device 32 is coupled with a node 33.

Plural switches 34, 36 are provided to implement selective coupling of charging device 30 and sampling device 32 with capacitor 20, respectively. First switch 34 is implemented intermediate node 31 coupled with charging device 30 and node 24. Second switch 36 is implemented intermediate node 33 coupled with sampling device 32 and node 24. Switches 34, 36 operate to selectively couple node 24 with respective nodes 31, 33. Switches 34, 36 are semiconductive (e.g., transistors) or micro-electromechanical in exemplary configurations.

In the described arrangement, electrical system 14 includes a switch control 38 to implement selective switching of charging device 30 and sampling device 32 with node 24 coupled with capacitor 20. Switch control 38 is configured to control individual switches 34, 36. Switch control 38 can be configured to control the operation of switches 34, 36 and selective coupling of charging device 30 and sampling device 32 with capacitor 20 responsive to the operation of micromechanical system 12. More specifically, switch control 38 can control switches 34, 36 responsive to the position of wheel 11. Synchronous operation of micromechanical system 12 and electrical system 14 is provided in accordance with the present invention.

First switch 34 operates to selectively couple charging device 30 with node 24. During such coupling, charging device 30 is configured to charge capacitor 20 to the voltage of charging device 30. Switch control 38 controls the selective charging of capacitor 20. Second switch 38 selectively couples sampling device 32 with node 24. Sampling device 32 can be configured to measure the voltage across the capacitor 20, selectively discharge the voltage from capacitor 20, and/or provide other operations. Switch control 38 controls the selective sampling and/or discharging of capacitor 20.

Referring to FIG. 5, one configuration for providing synchronization operations according to the present invention is described. The electrical system 14 of FIG. 4 comprising switches 34, 36 and switch control 38 is depicted coupled with synchronizer 16. Synchronizer 16 includes converter 13 comprising capacitor 20 in the presently described embodiment. Capacitor 20 operates to provide mechanical quantity to electrical quantity conversion operations implemented by converter 13 of FIG. 2. Capacitor 20 is coupled with a current-voltage (I-V) converter 44. Capacitor 20 and current-voltage converter 44 comprise mixer 15 of FIG. 2 and are coupled with low-pass filter 17.

Switch control 38 of electrical system 14 includes a controller 40 coupled with a time-dependent voltage source 42, such as an alternating current (AC) voltage source. Voltage source 42 is coupled with first switch 34 and second switch 36 and is configured to control the operation of switches 34, 36.

Controller 40 is additionally coupled with low-pass filter 17 and is configured to receive the filtered product signal from low-pass filter 17. Controller 40 is operable to control voltage source 42 responsive to the filtered product signal to provide synchronous operation of the mechanical system 12 and electrical system 14 of micro-electromechanical system 10.

Voltage source 42 is configured to operate according to the following equation $$V = V_0 * \sin(\omega_{elect} t + \theta)$$

The time-dependent voltage of voltage source 42 is additionally applied to capacitor 20. The output of capacitor 20 is applied to current-voltage converter 42. The application of the time-dependent voltage $V_0$ to the time-dependent capacitance $C_0$ of capacitor 20 and the operation of current-voltage converter 42 implement the functions of mixer 15. Thus, the output of current-voltage converter 42 comprises the product signal resulting from the mixing of $C_0$ and $V_0$.

The product signal is applied to low-pass filter 17 configured to remove higher order components from the product signal. More specifically, low-pass filter 17 outputs a filtered product signal substantially comprising the component proportional to $$\sin(((\omega_{mech} - \omega_{elect})t - \theta)$$

wherein θ represents the arbitrary phase between a fundamental frequency of the micromechanical system ($\theta_{mech}$) and a fundamental frequency of the electrical system ($\theta_{elect}$) This low pass filtering is equivalent to integrating the product signal over time. The filtered product signal can be utilized as a feedback control signal and is applied to controller 40. Controller 40 operates to control voltage source 42 to minimize differences between the fundamental frequencies of the micromechanical system 12 and the electrical system 14 ($\omega_{mech} - \omega_{elect}$) and the phase θ between the systems 12, 14 responsive to the filtered product signal. Such adjusts the operation of electrical system 14 and provides synchronous operation of electrical system 14 and micromechanical system 12.

Referring to FIG. 6, another configuration of micro-electromechanical system 10a is described. The depicted configuration of micro-electromechanical system 10a is operable to adjust micromechanical system 12a to provide synchronization of micromechanical system 12a and electrical system 14.

Micromechanical system 12a is configured to operate at a mechanical quantity, such as angular velocity, acceleration, etc. A controller 19 is coupled with micromechanical system 12a and is configured to control the operation of micromechanical system 12a. For example, controller 19 includes a voltage controlled oscillator (VCO) and a power amplifier configured to adjust the operation of micromechanical system 12a.

Micromechanical system 12a is coupled with synchronizer 16. As previously described, synchronizer 16 can include converter 13, mixer 15 and low-pass filter 17. Converter 13 can comprise capacitor 20 coupled with micromechanical system 12a. Converter 13 is configured to convert the mechanical quantity received from micromechanical system 12a into an electrical quantity.

Mixer 15 is coupled with converter 13 and electrical system 14. Mixer 15 is configured to mix the electrical quantity outputted from converter 13 and an electrical quantity outputted from electrical system 14. Mixer 15 generates a product signal responsive to the mixing of the electrical quantities.

Mixer 15 is coupled with low-pass filter 17. Mixer 15 applies the product signal to low-pass filter 17 which operates to remove higher order (e.g., second order and higher) components from the product signal. In the depicted micro-electromechanical system 10a, a filtered product signal comprising a control signal is outputted from low-pass filter 17 and applied to controller 19. Controller 19 adjusts the operation of micromechanical system 12 to provide synchronization of micromechanical system 12a with electrical system 14 responsive to the product signal.

Referring to FIG. 7, the depicted micro-electromechanical system 10a is implemented as a micro-electromechanical system voltage shifter similar to the previously described embodiment. In general, the depicted voltage shifter includes a micro-electromechanical gear wheel 11 and a parallel-plate capacitor 20 having a pair of capacitor plates 21, 22 as described above with reference to FIG. 2. Gear wheel 11 is configured to rotate and teeth 13 individually pass intermediate capacitor plates 21, 22 of capacitor 20 implementing voltage shifting operations. The rotation of gear wheel 11 may be referred to as a mechanical quantity.

The depicted gear wheel 11 of micro-electromechanical system 10a is coupled with an axle 23 and a motor 25. Unlike the operation of the micro-electromechanical voltage shifter system 10 of FIG. 2, gear wheel 11 rotates responsive to motor 25 applying a torque to axle 23. Motor 25 is controlled by controller 19. Motor 25 can comprise a micro-electromechanical motor, such as a side-drive electrostatic motor. Alternatively, gear wheel 11 may be implemented as a rotor of an micro-electromechanical motor.

Capacitor 20 operates as converter 13 shown in FIG. 6 to convert the mechanical quantity into an electrical quantity. Rotation of wheel 11 creates a time-dependent capacitance within capacitor 20 intermediate nodes 24, 26. The time-dependent capacitance can be utilized to provide synchronization between micromechanical system 12 and electrical system 14.

The output from capacitor 20 functioning as converter 13 may be applied to mixer 15 shown in FIG. 6. Mixer 15 receives the electrical quantity from converter 13 corresponding to the mechanical quantity of micromechanical system 12a. Further, mixer 15 receives an electrical quantity from electrical system 14 of FIG. 6. Electrical system 14 can operate a plurality of switches as previously described or provide other operations according to the electrical quantity.

Mixer 15 outputs a product signal to low-pass filter 17 shown in FIG. 6. Low-pass filter 17 applies a filtered product signal to controller 19. The operation of motor 25 is controlled by controller 19. In particular, controller 19 controls motor 25 responsive to the filtered product signal to provide synchronized operation of micromechanical system 12a and electrical system 14. For example, controller 19 synchronizes the rotation of gear wheel 11 with the operation of electrical system 14 in the presently described embodiment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A micro-electromechanical system voltage shifter comprising:

at least one node;

a capacitor including plural opposing conductive plates;

a micromechanical system configured to vary the capacitance of the capacitor;

an electrical system configured to selectively couple the capacitor and the at least one node; and a mixer configured to output a product signal to synchronize the micromechanical system and the electrical system.

2. The micro-electromechanical system voltage shifter according to claim 1 further comprising at least one switch coupled intermediate the at least one node and the capacitor.

3. The micro-electromechanical system voltage shifter according to claim 2 wherein the electrical system is configured to control the operation of the at least one switch.

4. The micro-electromechanical system voltage shifter according to claim 1 wherein the electrical system operates according to a first electrical quantity and the micromechanical system operates according to a mechanical quantity.

5. The micro-electromechanical system voltage shifter according to claim 4 wherein the capacitor is configured to convert the mechanical quantity to a second electrical quantity and the mixer is configured to mix the first electrical quantity and the second electrical quantity to generate the product signal.

6. The micro-electromechanical system voltage shifter according to claim 5 wherein the mixer applies the product signal to the electrical system.

7. The micro-electromechanical system voltage shifter according to claim 5 wherein the mixer applies the product signal to the micromechanical system.

8. The micro-electromechanical system voltage shifter according to claim 5 further comprising a low-pass filter coupled with the mixer and configured to filter the product signal.

9. The micro-electromechanical system voltage shifter according to claim 1 further comprising a sampling device coupled with the at least one node.

10. The micro-electromechanical system voltage shifter according to claim 1 further comprising a charging device coupled with the at least one node.

11. A micro-electromechanical system comprising:

an electrical system operating according to a first electrical quantity;

a micromechanical system operating according to a mechanical quantity; and a synchronizer configured to convert the mechanical quantity to a second electrical quantity, and to mix the first electrical quantity and the second electrical quantity to generate a product signal to synchronize the electrical system and the micromechanical system.

12. The micro-electromechanical system according to claim 11 wherein the synchronizer includes a low-pass filter coupled with the mixer and configured to integrate the product signal.

13. The micro-electromechanical system according to claim 11 wherein the electrical system includes a controller and the synchronizer is configured to output the product signal to the controller of the electrical system.

14. The micro-electromechanical system according to claim 11 wherein the mechanical system is coupled with a controller and the synchronizer is configured to output the product signal to the controller.

15. A micro-electromechanical system voltage shifter comprising:

a voltage source;

an output node;

a capacitor including plural opposing conductive plates;

a first switch operable to selectively couple the voltage source with the capacitor to charge the capacitor to a first voltage;

a micromechanical system configured to vary the capacitance of the capacitor to provide a second voltage across the capacitor, the micromechanical system being configured to operate according to a mechanical quantity;

a second switch operable to selectively couple the capacitor with the output node to provide sampling of the second voltage of the capacitor;

an electrical system configured to control the operation of at least one of the first switch and the second switch according to a first electrical quantity;

wherein the capacitor is configured to convert the mechanical quantity to a second electrical quantity;

a mixer configured to mix the first electrical quantity and the second electrical quantity to generate a product signal; and a low-pass filter configured to integrate the product signal and apply the product signal to one of the micromechanical system and the electrical system to synchronize the electrical system and the micromechanical system.

16. A method of synchronizing an electronic system and a micromechanical system of a micro-electromechanical system voltage shifter, the method comprising:

providing a capacitor and at least one node;

varying the capacitance of the capacitor using a micromechanical system;

selectively coupling the capacitor with the at least one node using an electrical system to one of charge the capacitor and provide sampling of the voltage of the capacitor; and synchronizing the electrical system and the micromechanical system.

17. The method according to claim 16 further comprising controlling a switch using the electrical system to provide the coupling.

18. The method according to claim 16 wherein the selectively coupling comprises coupling using the electrical system operating according to a first electrical quantity.

19. The method according to claim 17 wherein the varying comprises varying using the micromechanical system operating according to a mechanical quantity.

20. The method according to claim 19 further comprising:
converting the mechanical quantity to a second electrical quantity; and
generating a product signal from the first electrical quantity and the second electrical quantity.

21. The method according to claim 20 wherein the synchronizing comprises synchronizing using the product signal.

22. The method according to claim 20 wherein the synchronizing comprises applying the product signal to a controller of the electrical system.

23. The method according to claim 20 wherein the synchronizing comprises applying the product signal to a controller coupled with the mechanical system.

24. The method according to claim 20 wherein the generating comprises mixing the first electrical quantity and the second electrical quantity.

25. The method according to claim 20 further comprising lowpass filtering the product signal.

26. A method of synchronizing an electronic system and a micromechanical system of a micro-electromechanical system, the method comprising:
providing a micro-electromechanical system including an electrical system and a micromechanical system;
operating the electrical system according to a first electrical quantity;
operating the micromechanical system according to a mechanical quantity;
converting the mechanical quantity to a second electrical quantity;
generating a product signal from the first electrical quantity and the second electrical quantity; and
synchronizing the electronic system and the micromechanical system using the product signal.

27. The method according to claim 26 wherein the generating the product signal comprises mixing the first electrical quantity and the mechanical quantity.

28. The method according to claim 26 further comprising low-pass filtering the product signal.

29. The method according to claim 26 wherein the synchronizing comprises applying the product signal to a controller of the electrical system.

30. The method according to claim 26 wherein the synchronizing comprises applying the product signal to a controller coupled with the micromechanical system.

31. The method according to claim 26 wherein the synchronizing comprises adjusting the electrical system using the product signal.

32. The method according to claim 26 wherein the synchronizing comprises adjusting the mechanical system using the product signal.

* * * * *